United States Patent [19]

Ichinose et al.

[11] 4,290,188

[45] Sep. 22, 1981

[54] PROCESS FOR PRODUCING BIPOLAR SEMICONDUCTOR DEVICE UTILIZING PREDEPOSITION OF DOPANT AND A POLYCRYSTALLINE SILICON-GOLD FILM FOLLOWED BY SIMULTANEOUS DIFFUSION

[75] Inventors: Yoshito Ichinose, Kawasaki; Takeshi Fukuda, Tokyo; Naoaki Kobayashi, Kawasaki, all of Japan

[73] Assignee: Fujitsu Limited, Kawasaki, Japan

[21] Appl. No.: 116,974

[22] Filed: Jan. 30, 1980

[30] Foreign Application Priority Data

Jan. 31, 1979 [JP] Japan ................................. 54/10032

[51] Int. Cl.³ .................. H01L 21/283; H01L 21/324
[52] U.S. Cl. ....................................... 29/591; 29/578; 29/590; 148/174; 148/187; 148/188; 148/190; 357/59; 357/64; 357/67; 357/71
[58] Field of Search ............... 148/187, 188, 190, 174; 29/578, 590, 591; 357/64, 59, 67, 71

[56] References Cited

U.S. PATENT DOCUMENTS

| | | | |
|---|---|---|---|
| 3,473,976 | 10/1969 | Castrucci et al. | 148/188 X |
| 3,617,398 | 11/1971 | Bilous et al. | 148/190 X |
| 3,625,781 | 12/1971 | Joshi et al. | 148/187 X |
| 3,645,808 | 2/1972 | Kamiyama et al. | 148/188 X |
| 3,775,196 | 11/1973 | Wakamiya et al. | 148/188 X |
| 3,946,425 | 3/1976 | Shoji et al. | 357/64 |
| 4,144,106 | 3/1979 | Takeuchi | 148/188 X |
| 4,146,413 | 3/1979 | Yonezawa et al. | 29/578 X |

Primary Examiner—L. Dewayne Rutledge
Assistant Examiner—W. G. Saba
Attorney, Agent, or Firm—Staas & Halsey

[57] ABSTRACT

A process for manufacturing a bipolar semiconductor device. An epitaxial layer is formed on a silicon wafer, and a base layer is formed by the diffusion of impurities having one conductivity type in a part of the epitaxial layer. Impurities having the opposite conductivity type are deposited in a part of the base layer, polycrystalline silicon is deposited on the entire surface of the wafer which is provided with windows for emitter, base and collector electrodes, and a gold-containing film is applied on the entire surface of the polycrystalline silicon layer. Impurities having the opposite conductivity type are deposited and driven into the base layer so as to form an emitter layer and simultaneously gold atoms are driven in through the collector windows into a collector layer of the epitaxial layer and through the base and emitter windows into the collector layer.

10 Claims, 10 Drawing Figures

PROCESS FOR PRODUCING BIPOLAR SEMICONDUCTOR DEVICE UTILIZING PREDEPOSITION OF DOPANT AND A POLYCRYSTALLINE SILICON-GOLD FILM FOLLOWED BY SIMULTANEOUS DIFFUSION

BACKGROUND OF THE INVENTION

1. Field of the Invention

The present invention relates to a process for producing a bipolar semiconductor device, particularly a process comprising steps of simultaneously driving impurities into an emitter region and gold atoms into a collector layer.

2. Description of the Prior Art

It is necessary to improve the switching speed of semiconductor devices for use in logic circuits, i.e., the minority carriers of holes in the collector layer must disappear rapidly in its off-state operation. In order to decrease the life time of the minority carriers, gold is diffused into the collector layer in the silicon wafer.

There are two types of diffusion of gold atoms into the silicon crystal lattice, i.e., interstitial type and substitutional type, and only the gold atoms which are substituted for silicon atoms serve to promote the combination of holes and electrons, i.e., the switching speed of the semiconductor devices. The interstitial gold atoms diffuse among the silicon crystal lattice relatively rapidly. On the other hand, the substitutional gold atoms diffuse very slowly by replacing silicon atoms.

It is necessary not to convert the substitutional gold atoms into the interstitial gold atoms by rapidly cooling the silicon wafer.

In the prior art, gold is applied on the bottom surface of the silicon wafer either by evaporating gold or by spin coating a gold-containing solution and thereafter gold is driven forward into the collector layer located near the top surface of the wafer by heat treatment. This process is successfully carried out when the thickness of a silicon wafer is as thin as about 200~300 μm.

However, when the diameter of a silicon wafer is increased to about 90 mm, it becomes necessary to increase its thickness to 700 μm in order to avoid its deformation during heat treatment. The inevitable elongation of the heating time causes higher structural stress in the semiconductor devices located on the surface of the silicon wafer and deteriorates their electrical characteristics. The diffusion of gold atoms from the bottom surface through the silicon wafer is a long distance, and the interstitial gold atoms diffuse relatively rapidly in the silicon lattice up to the collector layer, where the silicon atoms are not yet substituted by the gold atoms.

SUMMARY OF THE INVENTION

It is an object of the present invention to diffuse gold into the collector layer in a shorter time so as to avoid the deformation of the wafer and also obtain stable electrical characteristics of the semiconductor devices thereon.

It is another object of the present invention to drive gold atoms into the collector layer, mainly as the substitutional type, so as to eliminate the necessity of rapid cooling to convert the interstitial type into the substitutional type.

It is still another object of the present invention to easily control the density of diffused gold independently of the thickness of the wafer.

It is a further object of the present invention to produce a bipolar semiconductor device in a simpler and easier manner.

Other objects and advantages of the present invention will further become apparent from the following description of the present invention.

According to the present invention, there is provided a process for manufacturing a bipolar semiconductor device comprising the steps of: forming an epitaxial layer on a silicon wafer; forming a base layer by diffusion of impurities having one conductivity type in a part of said epitaxial layer; depositing impurities having the opposite conductivity type in a part of said base layer; depositing polycrystalline silicon on the entire surface of said wafer which is provided with windows for emitter, base and collector electrodes; applying a gold-containing film on the entire surface of the polycrystalline silicon layer; simultaneously driving said deposited impurities having the opposite conductivity type into the emitter region so as to form an emitter layer and the atoms of said gold through said collector windows into a collector layer of said epitaxial layer and through said base and emitter windows into said collector layer; and, electrically connecting said emitter, base and collector layers within said device.

It is convenient for said electrically connecting step to comprise the steps of: removing said entire gold-containing film; depositing aluminum on said polycrystalline silicon layer; and patterning said layers of aluminum and polycrystalline silicon and heating them so as to form electrodes of double layers, one layer of aluminum and the other layer of aluminium silicide.

It is advantageous that polycrystalline silicon is deposited by the chemical vapor deposition of silane.

It is advisable that the gold-containing film is applied by spin coating an alcohol solution containing gold trichloride and silicic acid and drying said solution so as to form a thin film of silicon oxide containing gold.

It is preferable that said impurities having one conductivity type are composed of phosphorus and are deposited by a gas containing phosphorus oxychloride in an open tube, thereby forming a phosphorus silicate glass as a passivation film on the surface of said silicon oxide layer.

It is desirable that the simultaneous driving in of said impurities having the opposite conductivity type and gold atoms is carried out by heating said silicon wafer at a temperature from 900° to 1,200° C., preferably from 1,050° to 1,100° C.

If the heating temperature exceeds 1,200° C. crystalline defects occur in the silicon lattice, and if the heating is carried out under 900° C. minor numbers of gold atoms are driven in as the substitutional type.

DETAILED DESCRIPTION OF THE PREFERRED EMBODIMENTS

First, the diffusion of gold from the bottom surface of the silicon wafer in the prior art will be described.

Figure 1A:
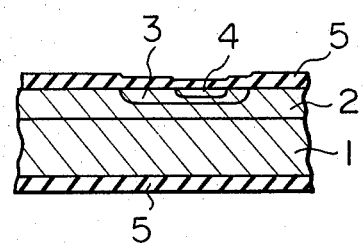
FIGS. 1 (a)-1 (e) show sectional views of a semiconductor device showing the process of the prior art.
Figure 1B:
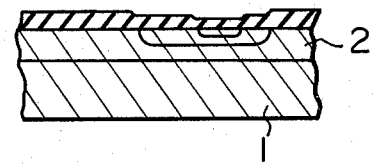
Figure 1C:
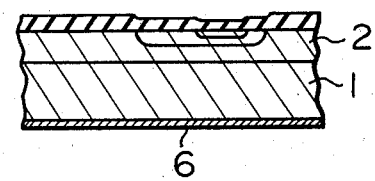
Figure 1D:
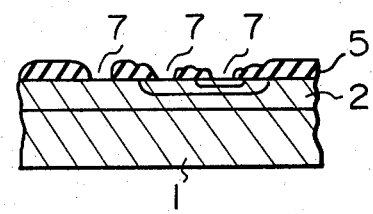
Figure 1E:
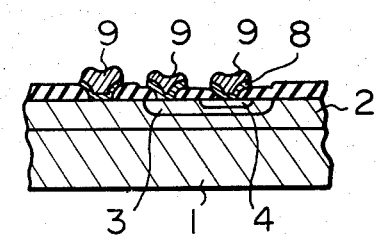

As shown in FIG. 1 (a), silicon wafer 1 having an n-type epitaxial layer 2, which includes a p-type base layer 3, which in turn includes an n-type emitter layer 4, is produced by a known process. During this process, an emitter window is opened in the silicon oxide layer 5, and phosphorus is deposited on the silicon oxide layer 5 so as to form a passivation film thereon and phosphorus is simultaneously deposited in the emitter window and the phosphorus is driven in as n-type impurities by heating at about 1100° C.

The silicon oxide layer 5 on the bottom surface of the wafer is washed off, whereas the silicon oxide layer 5 on the top surface remains (FIG. 1 (b)).

A thin film of gold 6 is deposited on the bottom surface to a thickness of about 1500 Å, e.g., by evaporation. The deposited gold is driven into the collector epitaxial layer 2 by heating the wafer at about 1000° C. for about 60 minutes. Thus, the gold atoms are driven in mainly as interstitial type into the epitaxial layer. Then the wafer must be rapidly cooled so as not to convert the substitutional type into the interstitial type (FIG. 1 (c)).

Windows 7 for collector, base and emitter electrodes are opened in the silicon oxide layer 5 (FIG. 1 (d)).

A polycrystalline silicon layer 8 is deposited on the wafer and an aluminum layer 9 is deposited on the polycrystalline silicon layer 8. Then, both layers are patterned and heated so as to form electrodes of double layers 8 and 9 (FIG. 1 (e)).

Figure 2A:
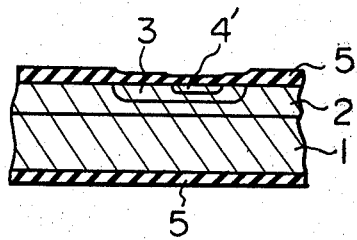
FIGS. 2 (a)-2 (e) sectional views of a semiconductor device showing the process of the present invention.
Figure 2B:
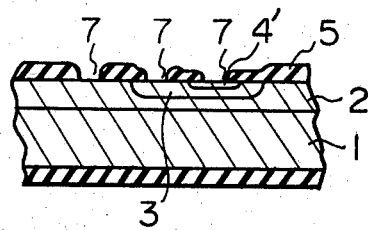
Figure 2C:
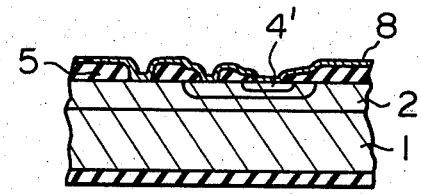
Figure 2D:
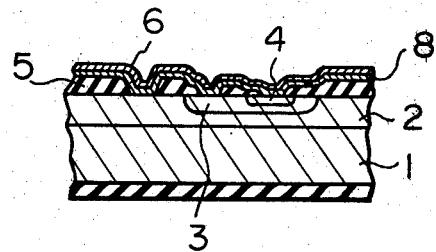
Figure 2E:
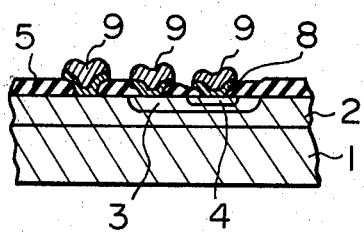

Referring to FIG. 2, an embodiment of the present invention will be described in detail.

The first half of the process is carried out similar to the prior art. Thus, as shown in FIG. 2 (a), a silicon wafer 1 is provided with a collector layer 2, a base layer 3, a phosphorus deposit 4' in the emitter region and a silicon oxide layer 5. The silicon oxide layer 5 is passivated by forming a phosphorus silicate glass film when phosphorus deposit 4' is formed, e.g., by the gas containing phosphorus oxychloride in an open tube at 950° C.

Then, the essential steps of the process in accordance with the present invention are carried out as follows.

The windows 7 for the collector, base and emitter electrodes are opened in the silicon oxide layer 5 on the top surface of the silicon wafer (FIG. 2 (b)).

A polycrystalline silicon layer 8 is deposited, e.g., by the chemical vapour deposition of silane at about 600° C., to a thickness of about 800 Å (FIG. 2 (c)). The deposition of the polycrystalline silicon layer 8 precedes the application of a gold-containing film 6. Thus, the polycrystalline silicon layer 8 protects the underlying silicon oxide layer 5 when the overlying gold-containing film 6 is washed off.

An alcoholic solution containing about 0.5% by weight of gold trichloride and about 6% by weight of silicic acid is spun on the polycrystalline silicon layer 8 and dried at about 450° C. so as to form a silicon oxide film containing gold 6 having a thickness of about 1000 Å (FIG. 2 (d)).

Then, the silicon wafer is heated at about 1100° C. for about 30 minutes so that the gold atoms in the silicon oxide film containing gold 6 are driven through the polycrystalline layer 8 of the electrode windows 7 into the collector layer 2 and so that the phosphorus deposit 4' is driven further deeper into the base layer 3 (FIG. 2 (d)).

The silicon oxide film containing gold 6 is washed off by immersing the wafer in 10% hydrofluoric acid and boiling it in nitric acid so as to stabilize the surface condition of the polycrystalline silicon layer 8.

A layer of aluminum is deposited in a known process, e.g., by a vaporization process, on the exposed polycrystalline silicon layer 8. Thereafter, the aluminum and polycrystalline silicon layers are successively patterned and heated at 450° C. so as to form electrodes consisting of double layers of aluminum and aluminum silicide alloy (FIG. 2 (e)). silicide alloy (FIG. 2 (e)).

The advantages of the present invention are as follows.

A thin film which contains gold is applied on the top surface of the silicon wafer, so that the operating conditions of the process are not affected by the thickness of the wafer. That is, the deformation of the wafer and the crystalline defects of silicon in the wafer do not occur, which deformation and defects would cause disallignment of patterning and leakage of P-N junctions, respectively. Besides, the semiconductor devices can be provided with shallow base junctions.

The density of gold in the film 6 can be controlled by adjusting the concentration of gold trichloride in the alcohol solution. Thus, although phosphorus and gold are simultaneously driven in, the density of phosphorus in the emitter layer and the density of gold in the collector layer are controlled independently of each other.

Thus, the diffusion of gold and phosphorus both from the top surface of the silicon wafer can be successfully carried out at the same time.

Therefore, the process for producing semiconductor devices is carried out much more rapidly, simply and easily than in the prior art.

The above-described embodiment of the present invention refers to a process which produces an n-p-n type bipolar semiconductor device. However, it is to be understood that the other type of bipolar semiconductors and other semiconductor devices can be produced, in accordance with the present invention, on the same silicon wafer simultaneously with the production of the n-p-n type bipolar semiconductor.

What we claim is:

1. A process for manufacturing a bipolar semiconductor device comprising the steps of:
    forming an epitaxial layer on a silicon wafer, said epitaxial layer comprising a collector layer of said device;
    forming a base layer of said device by diffusion of impurities having one conductivity type in a portion of said epitaxial layer within said collector layer;
    depositing an inpurity of the opposite conductivity type on a part of said base layer;
    selectively depositing polycrystalline silicon on the entire surface of said wafer to provide windows for emitter, base and collector electrodes of said device,
    applying a gold-containing film on the entire surface of the polycrystalline silicon layer;
    simultaneously driving (1) said deposited impurity having the opposite conductivity type into said part of said base layer so as to form an emitter layer within said base layer and (2) the atoms of said gold through said windows into the collector layer; and
    electrically connecting said emitter, base and collector layers within said device.

2. A process as claimed in claim 1, wherein said electrically connecting step comprises the steps of:
    removing entirely said gold-containing film;
    depositing aluminum on said polycrystalline silicon layer; and
    patterning said aluminum and polycrystalline silicon and heating said wafer to form electrodes of double layers, one layer of aluminum and the other layer of aluminum silicide.

3. A process as claimed in claim 1, wherein said polycrystalline silicon is deposited by chemical vapor deposition utilizing silane.

4. A process as claimed in claim 1, wherein said gold-containing film is applied by spin coating an alcohol solution containing gold trichloride and silicic acid and drying said solution so as to form a thin film of silicon oxide containing gold.

5. A process as claimed in claim 1, said impurity comprising phosphorus, said process including depositing the phosphorus impurity from a gas containing phosphorus oxychloride and forming a phosphorus silicate glass as a passivation film on the surface of said silicon oxide layer.

6. A process as claimed in claim 1, 4, or 5, wherein the simultaneous driving in of said impurities having the opposite conductivity type and gold atoms is carried out by heating said silicon wafer at a temperature in the range from 900° to 1,200° C.

7. A process as claimed in claim 6, wherein the simultaneous driving in of said impurities having the opposite conductivity type and gold atoms is carried out by heating said silicon wafer at a temperature in the range from 1,050° to 1,100° C.

8. The process of claim 1 or 5, said bipolar device being of an n-p-n type.

9. The process of claim 1, 2, 3, 4, 5, or 7 comprising rapidly cooling said wafer.

10. The process of claim 4 comprising forming said film of gold-containing silicon oxide to have a thickness of about 1000 angstroms.

* * * * *

UNITED STATES PATENT AND TRADEMARK OFFICE
CERTIFICATE OF CORRECTION

PATENT NO. : 4,290,188

DATED : 22 September 1981

INVENTOR(S) : YOSHITO ICHINOSE et al.

It is certified that error appears in the above—identified patent and that said Letters Patent is hereby corrected as shown below:

```
Col. 1, line 50, "is" should be --involves--.
Col. 2, line 23, delete ",";
        line 32, "aluminium" should be --aluminum--;
        lines 48, 50 and 52, "C." should be --C--;
        line 58, before "sectional" insert --show--.
Col. 3, lines 13, 43, 52 and 55, "C." should be --C--;
        line 42, "vapour" should be --vapor--.
Col. 4, line 2, "C." should be --C--;
        line 4, after the first "." delete the phrase
           "silicide alloy (FIG. 2(e)).";
        line 12, "disallign-" should be --disalign---;
        line 47, "inpurity" should be --impurity--;
        line 52, "," should be --;--.
```

Signed and Sealed this

Fifth Day of January 1982

[SEAL]

Attest:

GERALD J. MOSSINGHOFF

*Attesting Officer*     *Commissioner of Patents and Trademarks*